US012677372B2

(12) United States Patent
Fang

(10) Patent No.: US 12,677,372 B2
(45) Date of Patent: Jul. 7, 2026

(54) CIRCUIT BOARD, ELECTRONIC DEVICE HAVING THE CIRCUIT BOARD AND METHOD OF MANUFACTURING THE ELECTRONIC DEVICE

(71) Applicant: QUAN MEI TECHNOLOGY CO., LTD., Kaohsiung City (TW)

(72) Inventor: Ching-Ming Fang, Kaohsiung City (TW)

(73) Assignee: QUAN MEI TECHNOLOGY CO., LTD., Kaohsiung City (TW)

( * ) Notice: Subject to any disclaimer, the term of this patent is extended or adjusted under 35 U.S.C. 154(b) by 179 days.

(21) Appl. No.: 18/414,732

(22) Filed: Jan. 17, 2024

(65) Prior Publication Data

US 2024/0244749 A1    Jul. 18, 2024

(30) Foreign Application Priority Data

Jan. 18, 2023    (TW) ................................. 112102306

(51) Int. Cl.
| | |
|---|---|
| *H05K 1/11* | (2006.01) |
| *H01R 12/58* | (2011.01) |
| *H01R 43/02* | (2006.01) |
| *H05K 3/00* | (2006.01) |
| *H05K 3/42* | (2006.01) |

(52) U.S. Cl.
CPC ............. *H05K 1/115* (2013.01); *H01R 12/58* (2013.01); *H01R 43/0256* (2013.01); *H05K 3/0047* (2013.01); *H05K 3/423* (2013.01); *H05K 2201/09854* (2013.01); *H05K 2203/0723* (2013.01)

(58) Field of Classification Search
CPC ................... H05K 1/115; H05K 1/116; H05K 2201/09854; H05K 2201/09845; H05K 2201/09836; H05K 2201/09827; H05K 2201/09863; H05K 2201/10295; H05K 2201/10303; H05K 2201/1059; H05K 2201/10613; H05K 2201/10621; H05K 2201/10628; H05K 2201/10742–1081; H05K 2201/10856–10878; H01R 12/53; H01R 12/58; H01R 43/0256
See application file for complete search history.

(56) References Cited

U.S. PATENT DOCUMENTS

| | | | | |
|---|---|---|---|---|
| 2008/0227315 A1* | 9/2008 | Banno | ..................... | H01R 12/58 |
| | | | | 439/82 |
| 2018/0310405 A1* | 10/2018 | Iriguchi | ................... | H05K 3/22 |
| 2020/0245461 A1* | 7/2020 | Kaibuki | ................... | H05K 3/42 |

* cited by examiner

*Primary Examiner* — Roshn K Varghese

(74) *Attorney, Agent, or Firm* — MUNCY, GEISSLER, OLDS & LOWE, P.C.

(57)    ABSTRACT

A circuit board includes a substrate having opposite upper and lower surfaces, and an insertion hole extending through the upper and lower surfaces and having an expansion hole portion and an insertion hole portion connected to and communicating with each other. The insertion hole has a maximum width measured from one end of the insertion hole portion passing radially through the centers of the insertion hole portion and the expansion hole portion to one end of the expansion hole portion that is radially opposite to the one end of the insertion hole portion. The maximum width is greater than a hole diameter of the insertion hole portion, while the hole diameter of the insertion hole portion is greater than a hole diameter of the expansion hole portion. An electronic device having the circuit board and a method of manufacturing the same are also disclosed.

3 Claims, 8 Drawing Sheets

CIRCUIT BOARD, ELECTRONIC DEVICE HAVING THE CIRCUIT BOARD AND METHOD OF MANUFACTURING THE ELECTRONIC DEVICE

CROSS-REFERENCE TO RELATED APPLICATION

This application claims priority to Taiwanese Invention Patent Application No. 112102306, filed on Jan. 18, 2023.

FIELD

The present disclosure relates to a circuit board, an electronic device having the circuit board, and a method of manufacturing the electronic device.

BACKGROUND

A circuit board, apart from having to lay out a plurality of electronic circuits and a plurality of electronic components on a plate body thereof, further has to provide an insertion hole in the plate body thereof for insertion of an insert member therethrough and for external connection, after which the circuit board and the insert member are passed through a wave soldering process in a tin oven to achieve the purpose of electrical connection.

Currently, the insertion hole is usually designed as a circular hole, and the insert member includes a terminal post inserted into the insertion hole, two protruding arms extending outwardly and horizontally from two opposite sides of the terminal post and resting on an upper side of the circuit board, and two protruding legs extending upwardly and inclinedly from the two opposite sides of the terminal post and abutting against a lower side of the circuit board. A maximum distance between opposite side edges of the two protruding legs is greater than a hole diameter of the insertion hole. When the insert member is inserted downwardly into the insertion hole of the circuit board, the protruding legs thereof are squeezed inwardly toward the terminal post and are folded due to the limitation of the size of the insertion hole. However, due to the poor resilience of the protruding legs, it is not easy for the protruding legs to rebound and unfold after passing through the insertion hole, causing failure to an engaging effect thereof. Furthermore, during the wave soldering process in the tin oven, liquid tin will push the insert member upward to displace, causing poor soldering and affecting the bonding, thereby reducing yield rate of the circuit board.

SUMMARY

Therefore, an object of the present disclosure is to provide a circuit board that can alleviate at least one of the drawbacks of the prior art.

According to one aspect of this disclosure, the circuit board includes a substrate having opposite upper and lower surfaces, and an insertion hole extending through the upper and lower surfaces and having an expansion hole portion and an insertion hole portion connected to and communicating with each other. The insertion hole has a maximum width measured from one end of the insertion hole portion passing radially through the centers of the insertion hole portion and the expansion hole portion to one end of the insertion hole portion. The maximum width is greater than a hole diameter of the insertion hole portion, while the hole diameter of the insertion hole portion is greater than a hole diameter of the expansion hole portion.

Another object of the present disclosure is to provide an electronic device that can alleviate at least one of the drawbacks of the prior art.

According to another aspect of this disclosure, the electronic device includes a circuit board and an insert member. The circuit board includes a substrate and a conductive layer. The substrate has opposite upper and lower surfaces, and an insertion hole extending through the upper and lower surfaces. The substrate includes a base layer and two copper foil layers respectively covering upper and lower sides of the base layer and respectively serving as the upper and lower surfaces of the substrate. The insertion hole has an expansion hole portion and an insertion hole portion connected to and communicating with each other. The insertion hole has a maximum width measured from one end of the insertion hole portion passing radially through the centers of the insertion hole portion and the expansion hole portion to one end of the expansion hole portion that is radially opposite to the one end of the insertion hole portion. The maximum width is greater than a hole diameter of the insertion hole portion, while the hole diameter of the insertion hole portion is greater than a hole diameter of the expansion hole portion. The conductive layer is disposed in the insertion hole and electrically connected to the copper foil layers.

The insert member is inserted into the insertion hole, and includes an axially extending terminal post, at least two protruding arms extending radially and outwardly from two diametrically opposed sides of the terminal post and resting on the upper surface of the substrate, and at least two protruding legs that extend upwardly and inclinedly from the two diametrically opposed sides of the terminal post, that are spaced apart from and located below the protruding arms and that abut against the lower surface of the substrate. A maximum distance measured from a free end of one of the at least two protruding legs to a free end of the other one of the at least two protruding legs is smaller than the maximum width of the insertion hole but greater than the hole diameter of the insertion hole portion.

A further object of the present disclosure is to provide an electronic device that can alleviate at least one of the drawbacks of the prior art.

According to a further aspect of this disclosure, the electronic device includes a circuit board and an insert member. The substrate has opposite upper and lower surfaces, and an insertion hole extending through the upper and lower surfaces. The substrate includes a base layer and a copper foil layer covering a lower side of the base layer and serving as the lower surface of the substrate. The insertion hole has an expansion hole portion and an insertion hole portion connected to and communicating with each other. The insertion hole has a maximum width measured from one end of the insertion hole portion passing radially through the centers of the insertion hole portion and the expansion hole portion to one end of the expansion hole portion that is radially opposite to the one end of the insertion hole portion. The maximum width is greater than a hole diameter of the insertion hole portion, while the hole diameter of the insertion hole portion is greater than a hole diameter of the expansion hole portion.

The insert member is inserted into the insertion hole, and includes a terminal post inserted into the insertion hole and extending out of the lower surface of the substrate, at least two protruding arms extending radially and outwardly from two diametrically opposed sides of the terminal post and resting on the upper surface of the substrate, at least two protruding arms extending radially and outwardly from two diametrically opposed sides of the terminal post and resting on the upper surface of the substrate, and at least two protruding legs that extend outwardly and inclinedly from the two diametrically opposed sides of the terminal post, that are spaced apart from and located below the protruding arms and that abut against the lower surface of the substrate. A maximum distance measured from a free end of one of the at least two protruding legs to a free end of the other one of the at least two protruding legs is smaller than the maximum width of the insertion hole but greater than the hole diameter of the insertion hole portion.

Still another object of the present disclosure is to provide a method of manufacturing an electronic device that can alleviate at least one of the drawbacks of the prior art.

According to still another aspect of this disclosure, the method of manufacturing the electronic device includes the steps of:

a) preparing a substrate and an insert member, the substrate including a base layer and two copper foil layers respectively covering upper and lower sides of the base layer, the insert member including a terminal post, at least two protruding arms extending radially and outwardly from two diametrically opposed sides of the terminal post, and at least two protruding legs that extend upwardly and inclinedly from the two diametrically opposed sides of the terminal post and that are spaced apart from and located below the at least two protruding arms;

b) drilling a hole in the substrate to form an expansion hole portion, and drilling another hole in the substrate to form an insertion hole portion that partially overlaps with the expansion hole portion, that communicates with the expansion hole portion, and that cooperates with the expansion hole portion to form an insertion hole in the substrate, the insertion hole portion having a hole diameter greater than a hole diameter of the expansion hole portion, the insertion hole having a maximum width measured from one end of the insertion hole portion passing radially through the centers of the insertion hole portion and the expansion hole portion to one end of the expansion hole portion that is radially opposite to the one end of the insertion hole portion;

c) forming a conductive layer at the insertion hole of the substrate by electroplating to form a circuit board, the conductive layer having a cylindrical portion electroplated on a wall surface of the substrate that defines the insertion hole, and two annular portions that extend outwardly, radially and respectively from upper and lower ends of the cylindrical portion, that respectively surround upper and lower ends of the insertion hole and that are respectively electroplated on the copper foil layers;

d) placing the insert member above the insertion hole with the at least two protruding legs aligned with the expansion hole portion and the insertion hole portion of the insertion hole and then inserting the insert member downwardly through the maximum width of the insertion hole until the at least two protruding arms of the insert member rest on an upper one of the annular portions of the conductive layer and the at least two protruding legs of the insert member extend out of the insertion hole, after which the insert member is moved laterally to align an axis of the terminal post with the center of the insertion hole portion, and then rotated by an angle so as to move the at least two protruding legs out of the maximum width of the insertion hole and abut against a lower one of the annular portions of the conductive layer; and e) placing the circuit board inserted with the insert member into a tin oven having a molten solder body so as to fill the insertion hole with the molten solder body and to solder the insert member and the conductive layer of the circuit board.

Yet another object of the present disclosure is to provide a method of manufacturing an electronic device that can alleviate at least one of the drawbacks of the prior art.

According to yet another aspect of this disclosure, the method of manufacturing the electronic device includes the steps of:

a) preparing a substrate and an insert member, the substrate including a base layer and a copper foil layer covering a lower side of the base layer, the insert member including a terminal post, at least two protruding arms extending radially and outwardly from two diametrically opposed sides of the terminal post, and at least two protruding legs that extend upwardly and inclinedly from the two diametrically opposed sides of the terminal post and that are spaced apart from and located below the at least two protruding arms;

b) drilling a hole in the substrate to form an expansion hole portion, and drilling another hole in the substrate to form an insertion hole portion that partially overlaps with the expansion hole portion, that communicates with the expansion hole portion, and that cooperates with the expansion hole portion to form an insertion hole in the substrate, the insertion hole portion having a hole diameter greater than a hole diameter of the expansion hole portion, the insertion hole having a maximum width measured from one end of the insertion hole portion passing radially through the centers of the insertion hole portion and the expansion hole portion to one end of the expansion hole portion that is radially opposite to the one end of the insertion hole portion;

c) placing the insert member above the insertion hole with the at least two protruding legs aligned with the expansion hole portion and the insertion hole portion of the insertion hole and then inserting the insert member downwardly through the maximum width of the insertion hole until the at least two protruding arms of the insert member rest on an upper side of the conductive layer and the at least two protruding legs of the insert member extend out of the insertion hole, after which the insert member is moved laterally to align an axis of the terminal post with the center of the insertion hole portion, and then rotated by an angle so as to move the at least two protruding legs out of the maximum width of the insertion hole and abut against the copper foil layer; and d) placing the circuit board inserted with the insert member into a tin oven having a molten solder body to solder the insert member and the copper foil layer.

BRIEF DESCRIPTION OF THE DRAWINGS

Other features and advantages of the disclosure will become apparent in the following detailed description of the embodiments with reference to the accompanying drawings. It is noted that various features may not be drawn to scale.

DETAILED DESCRIPTION

Figure 1:
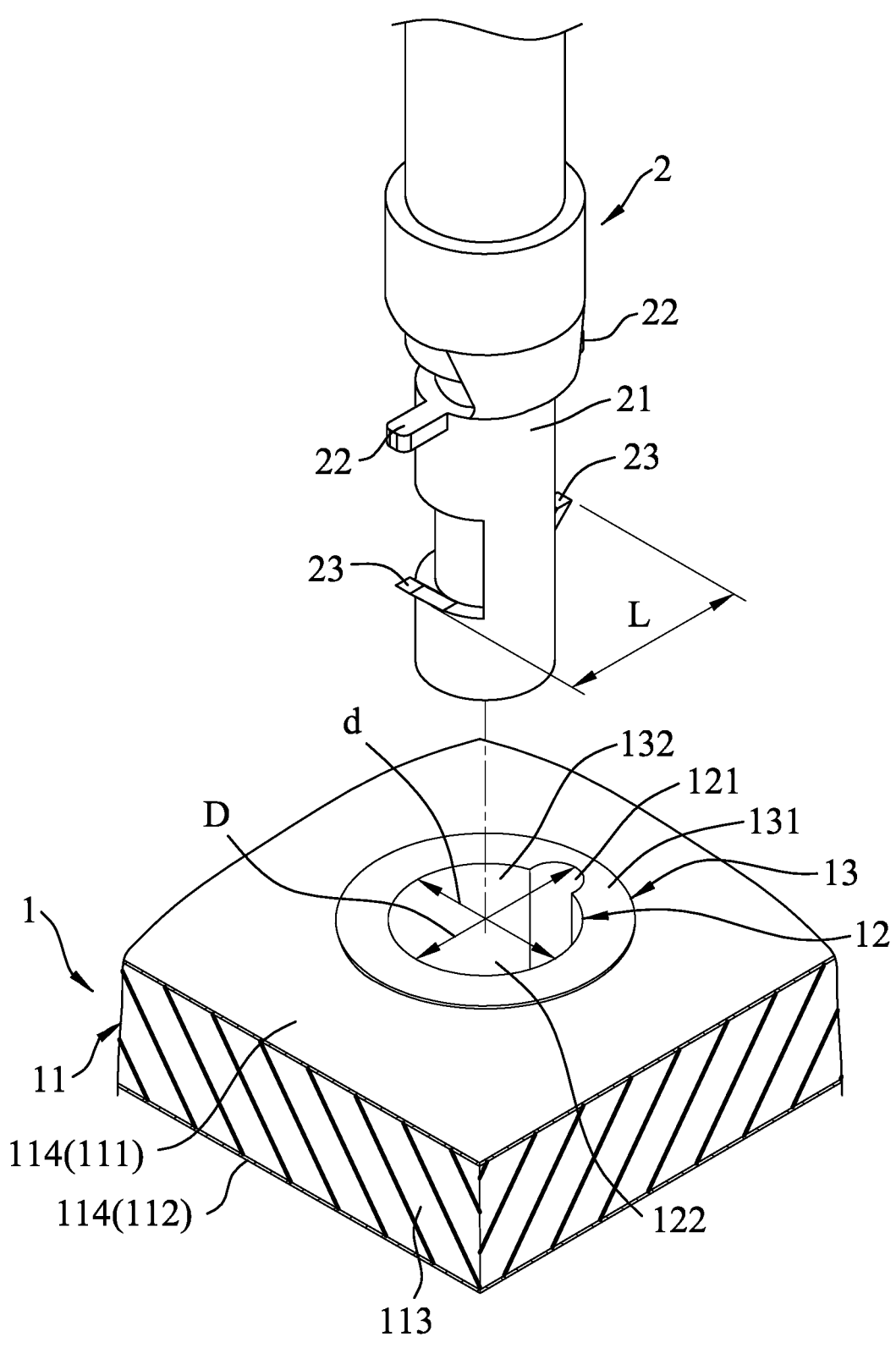
FIG. 1 is a fragmentary partly sectional exploded perspective view of an electronic device according to the first embodiment of the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
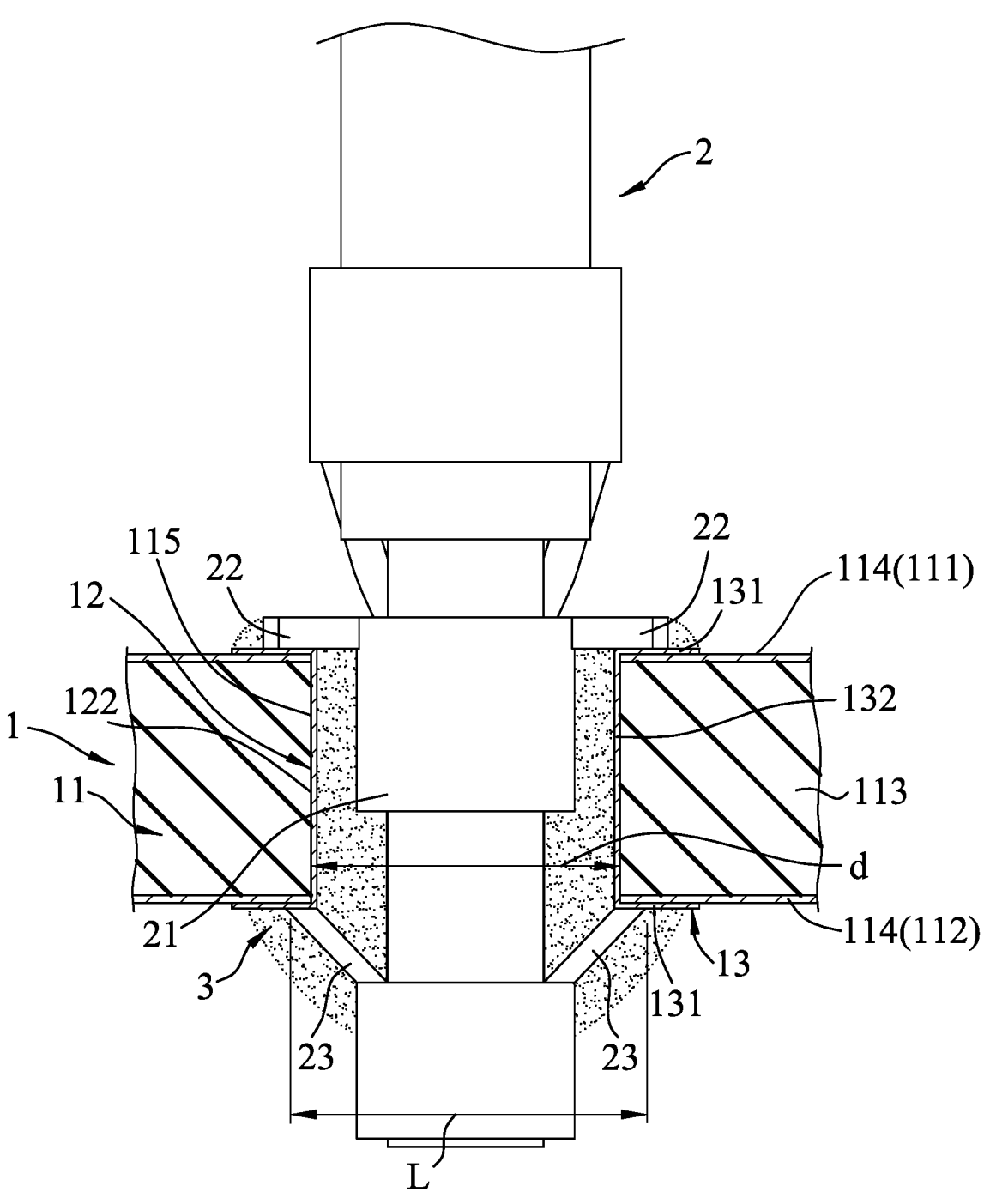
FIG. 2 is a fragmentary partly sectional view of the first embodiment in an assembled state.

Referring to FIGS. 1 and 2, an electronic device according to the first embodiment of the present disclosure includes a circuit board 1, an insert member 2, and a solder body 3.

The circuit board 1 of the first embodiment is a double-sided printed circuit board (PCB), and includes a substrate 11 and a conductive layer 13. In terms of the overall profile, the substrate 11 has an upper surface 111 and a lower surface 112 opposite to each other, and an insertion hole 12 extending through the upper and lower surfaces 111, 112. In terms of the layered structure, the substrate 11 includes a base layer 113 and two copper foil layers 114 respectively covering upper and lower sides of the base layer 113. The base layer 113 of the first embodiment is a single layer, and is an insulating layer made of, for example, but not limited to, bakelite or glass fiber. The copper foil layers 114 respectively serve as the upper and lower surfaces 111, 112 of the substrate 11. Alternatively, the circuit board 1 may be a multi-layered PCB, and in this case, the base layer 113 is multi-layered stacked with multiple insulating layers and at least one copper foil layer (not shown), details of which are omitted herein for the sake of brevity.

Figure 4:
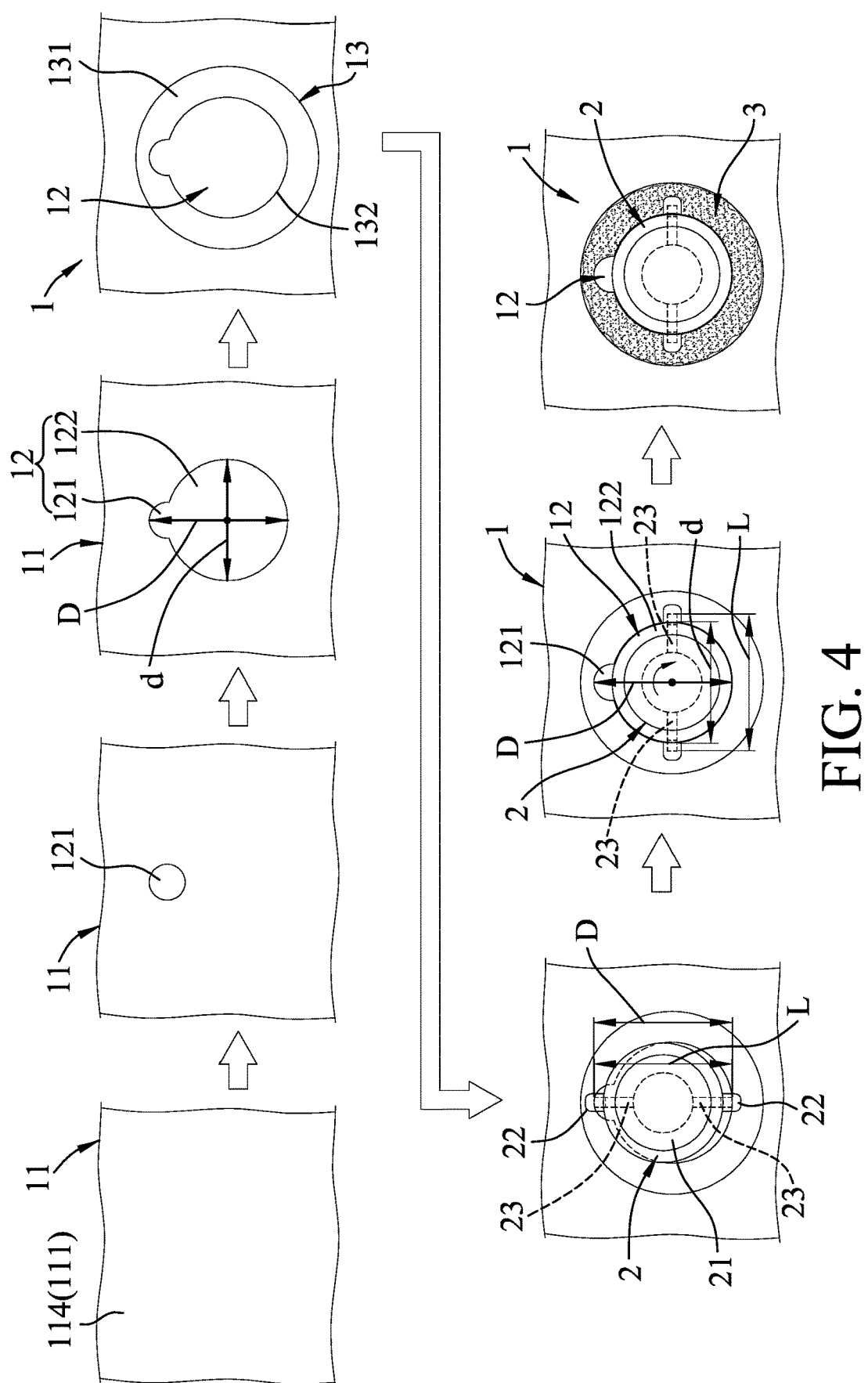
FIG. 4 is a corresponding top view of FIG. 3.

The insertion hole 12 has an expansion hole portion 121 and an insertion hole portion 122 connected to and communicating with each other. During manufacture, as shown in FIG. 4, the expansion hole portion 121 is a small round hole, and the insertion hole portion 122 is a large round hole. However, after they are connected and communicated, the expansion hole portion 121 and the insertion hole portion 122 overlap each other and form a fan-shaped configuration. Alternatively, the shape of each of the expansion hole portion 121 and the insertion hole portion 122 may be changed, and is not limited to the disclosed embodiment. For example, the expansion hole portion 121 may have a rectangular shape. The insertion hole 12 has a maximum width (D) measured from one end of the insertion hole portion 122 passing radially through the center of the insertion hole portion 122 and the center of the expansion hole portion 121 to one end of the expansion hole portion 121 that is radially opposite to the one end of the insertion hole portion 122. The maximum width (D) is greater than a hole diameter (d) of the insertion hole portion 122, and the hole diameter (d) of the insertion hole portion 122 is greater than a hole diameter of the expansion hole portion 121.

The conductive layer 13 is electrically connected to the copper foil layers 114, and has a cylindrical portion 132 electroplated on a wall surface 115 of the substrate 11 that defines the insertion hole 12, and two annular portions 131 that extend outwardly, radially and respectively from upper and lower ends of the cylindrical portion 132, that respectively surround upper and lower ends of the insertion hole 12, and that are respectively electroplated on the copper foil layers 114. Through this, the insertion hole 12 is formed as a plating through hole. It should be noted that since the conductive layer 13 is a covering layer that surrounds the insertion hole 12, for convenience of illustrating the size relationship between the insertion hole 12 and the insert member 2, some ranges of the hole diameter indicated in each drawing are pointing to the conductive layer 13 electroplated on the wall surface 115 of the substrate 11 that defines the insertion hole 12.

The insert member 2 is inserted into the insertion hole 12 of the circuit board 1, and includes an axially extending terminal post 21, two protruding arms 22 extending radially, outwardly from two diametrically opposed sides of the terminal post 21 and resting on the upper surface 111 of the substrate 11, and two protruding legs 23 that extend upwardly and inclinedly from the two diametrically opposed sides of the terminal post 21, that are spaced apart from and located below the protruding arms 22, and that abut against the lower surface 112 of the substrate 11. A maximum distance (L) measured from a free end of one of the protruding legs 23 to a free end of the other protruding leg 23 is smaller than the maximum width (D) of the insertion hole 12, but greater than the hole diameter (d) of the insertion hole portion 122. It should be noted that the number of the protruding arms 22 or the protruding legs 23 is not limited to two, and may be three, four or more according to actual requirements.

The solder body 3 is soldered between the insert member 2 and the conductive layer 13 of the circuit board 1. That is, the solder body 3 is soldered between the protruding arms 22 and an upper one of the annular portions 131 of the conductive layer 13, between the terminal post 21 and the cylindrical portion 132 of the conductive layer 13, and between the protruding legs 23 and a lower one of the annular portions 131 of the conductive layer 13. Through this, the insert member 2 is electrically connected to the circuit board 1.

Figure 3:
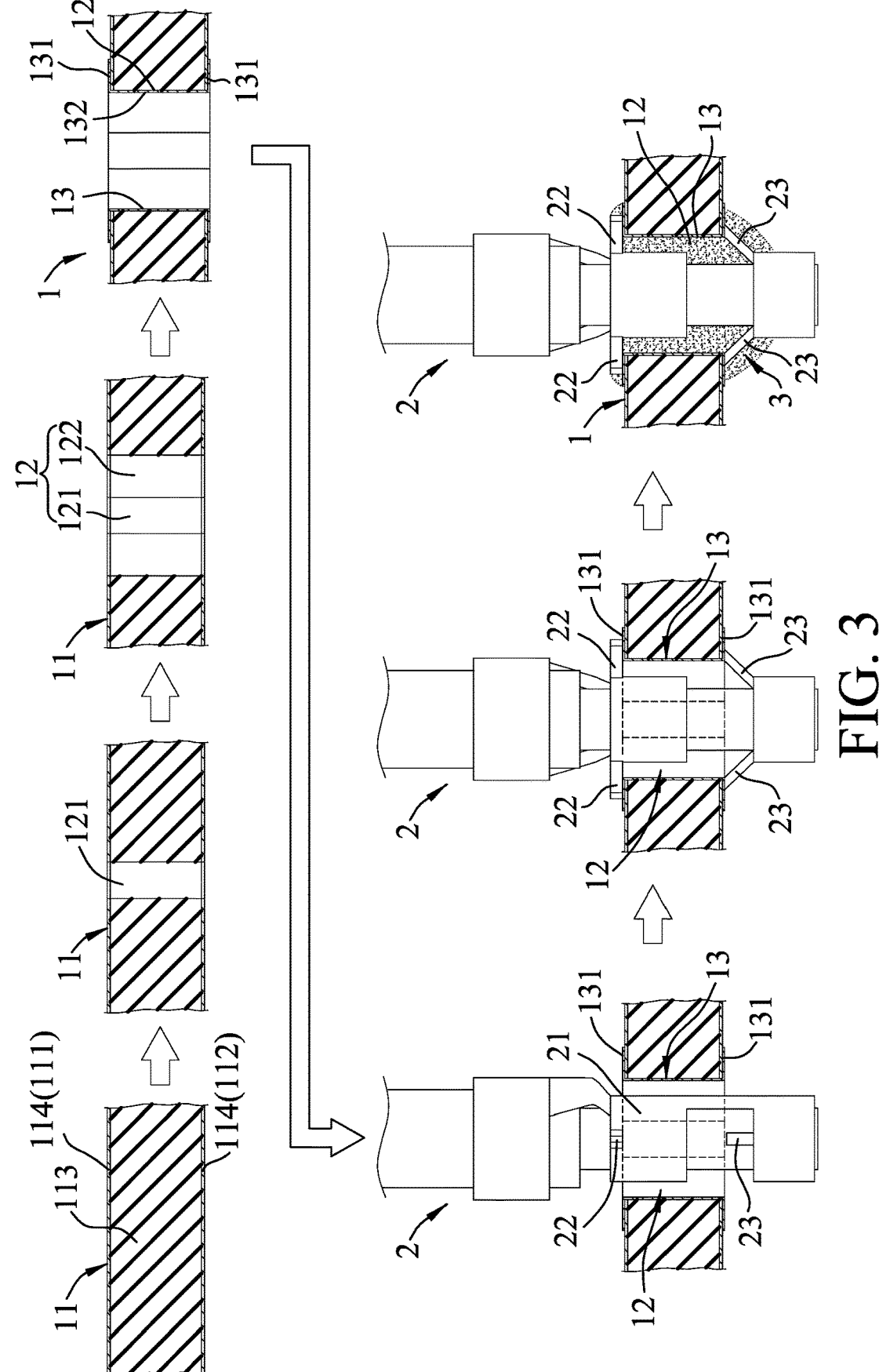
FIG. 3 is a sectional view of the steps involved in a method of manufacturing the electronic device of the first embodiment.

Referring to FIGS. 3 and 4, in combination with FIG. 1, to further understand the structure of the electronic device, a method of manufacturing the electronic device of the first embodiment is described below, and includes the steps of:

a) preparing the substrate 11 and the insert member 2, the substrate 11 having the base layer 113 and the copper foil layers 114, the insert member 2 including the terminal post 21, the protruding arms 22 and the protruding legs 23;

b) drilling a hole in the substrate 11 to form the expansion hole portion 121, and drilling another hole in the substrate 11 to form the insertion hole portion 122 that partially overlaps with the expansion hole portion 121, that communicates with the expansion hole portion 121, and that cooperates with the expansion hole portion 121 to form the insertion hole 12;

c) forming the conductive layer 13 at the insertion hole 12 of the substrate 11 by electroplating to form the circuit board 1, the conductive layer 13 having the annular portions 131 and the cylindrical portion 132;

d) placing the insert member 2 above the insertion hole 12 with the protruding legs 23 aligned with the expansion hole portion 121 and the insertion hole portion 122, and then inserting the insert member 2 downwardly through the maximum width (D) of the insertion hole 12 until the protruding arms 22 rest on the upper annular portion 131 of the conductive layer 13 and the protruding legs 23 extend out of the insertion hole 12, after which the insert member 2 is moved laterally to align an axis of the terminal post 21 with the center of the insertion hole portion 122, and then rotated by an angle so as to move the protruding legs 23 away from the maximum width (D) of the insertion hole 12 and abut against the lower annular portion 131 of the conductive layer 13, thereby completing the insertion assembly of the insert member 2; and e) placing the circuit board (1) 1 inserted with the insert member 2 into a tin oven (not shown) having a molten solder body 3 so as to fill the insertion hole 12 with the solder body 3 and to solder the insert member 2 and the conductive layer 13 of the circuit board 1, thereby fixing and electrically connecting the insert member 2 and the circuit board 1.

Figure 5:
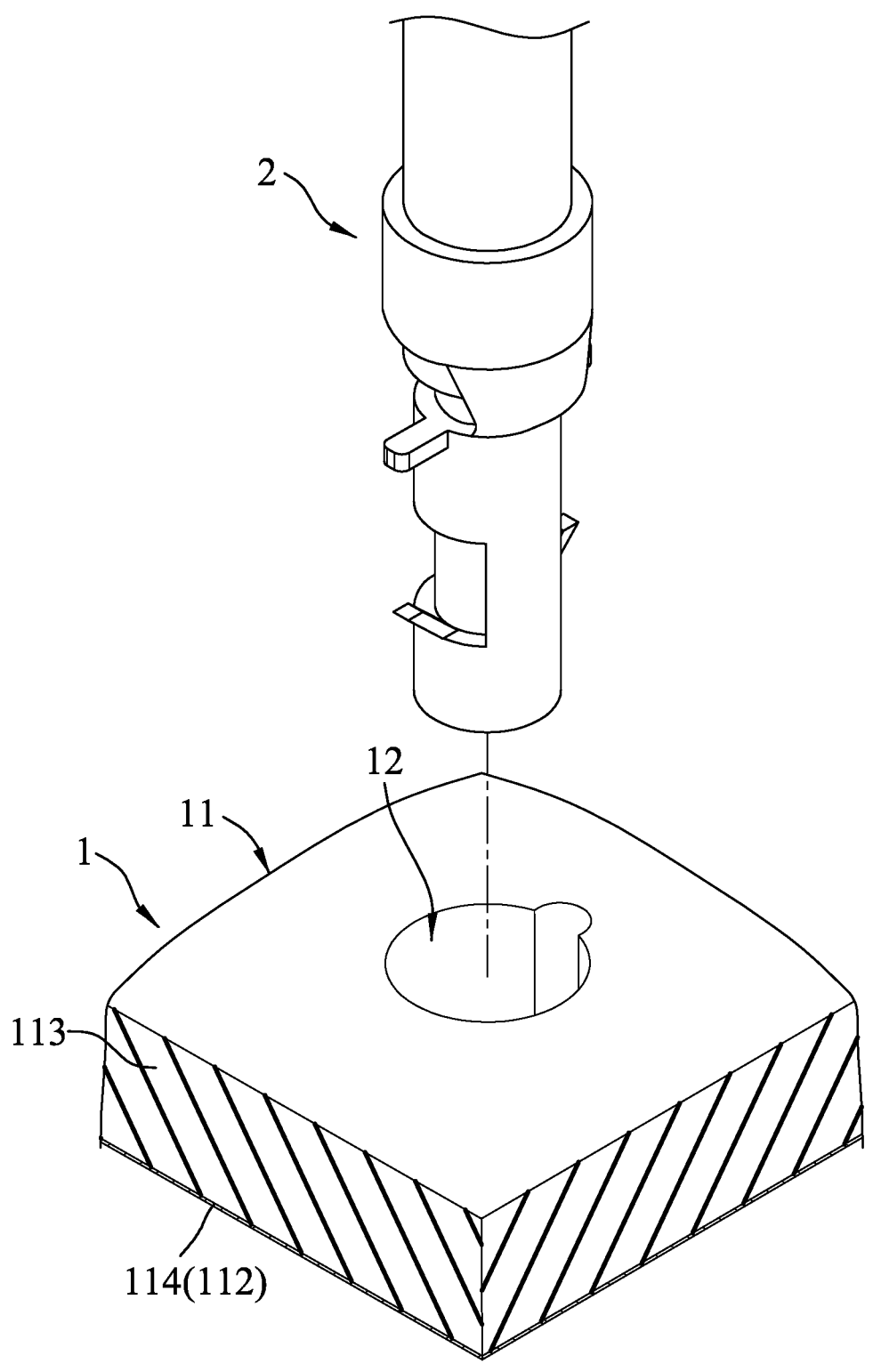
FIG. 5 is a fragmentary partly sectional exploded perspective view of an electronic device according to the second embodiment of the present disclosure.
Figure 6:
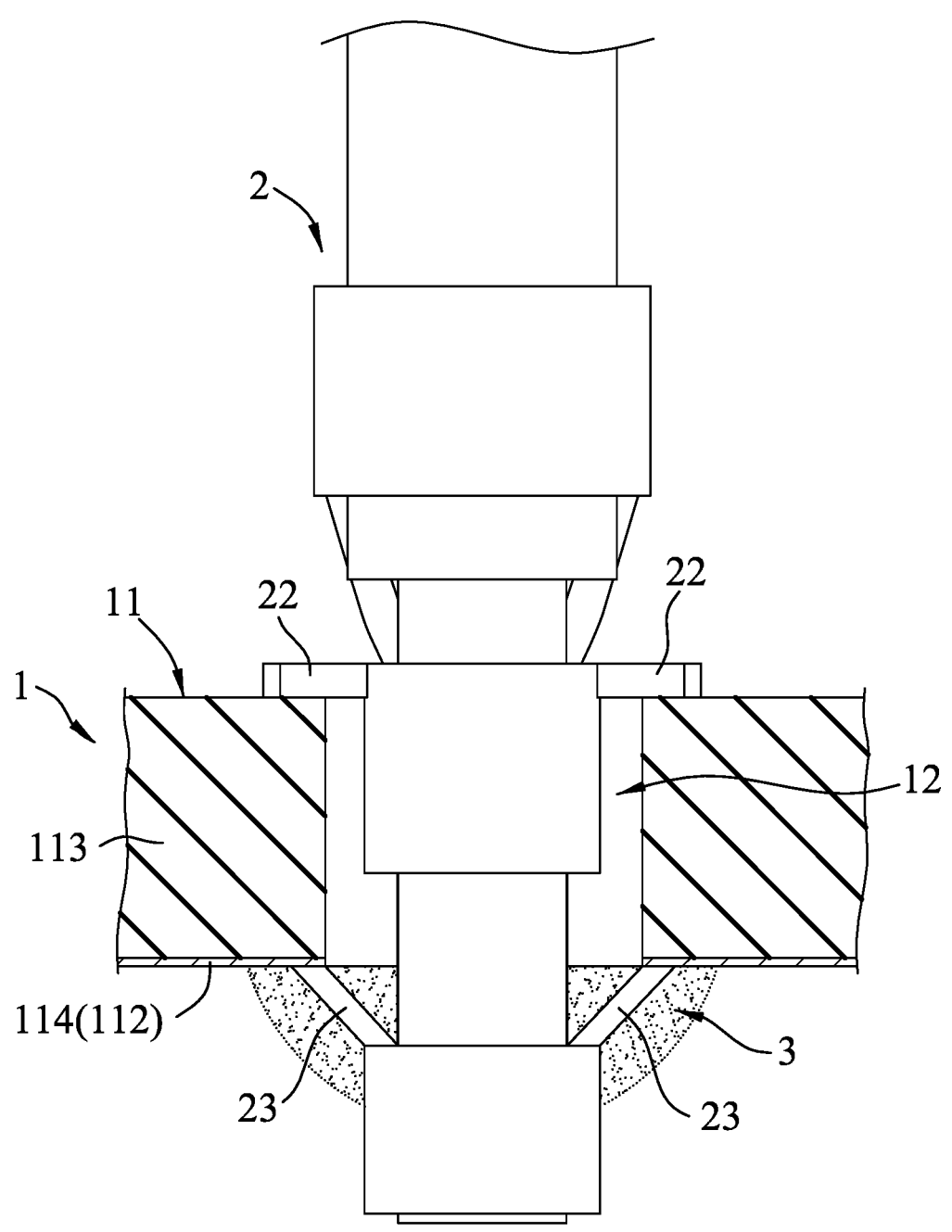
FIG. 6 is fragmentary partly sectional view of the second embodiment in an assembled state.

Referring to FIGS. 5 and 6, the structure of the second embodiment of the electronic device of the present disclosure is shown to be substantially identical to that of the first embodiment, but differs in that, in the second embodiment, the circuit board 1 is a single-sided PCB, so that the substrate 11 has only one copper foil layer 114 covering the lower side of the base layer 113 and serving as the lower surface 112 thereof. In this case, the conductive layer 13 (see FIG. 2) can be omitted in the circuit board 1 of the second embodiment, and the solder body 3 is soldered only between the protruding legs 23 and the copper foil layer 114.

Figure 7:
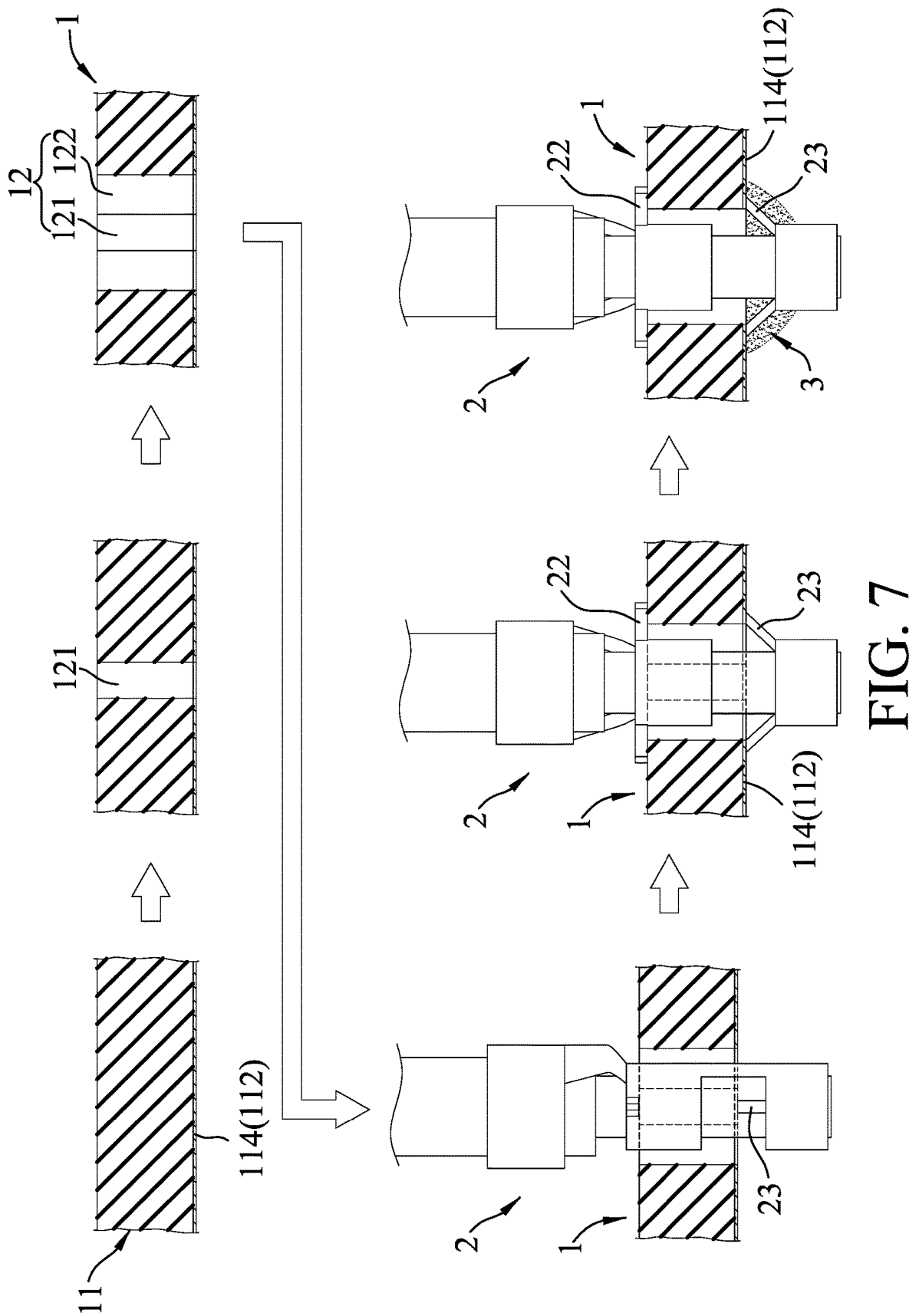
FIG. 7 is a sectional view of the steps involved in a method of manufacturing the electronic device of the second embodiment.
Figure 8:
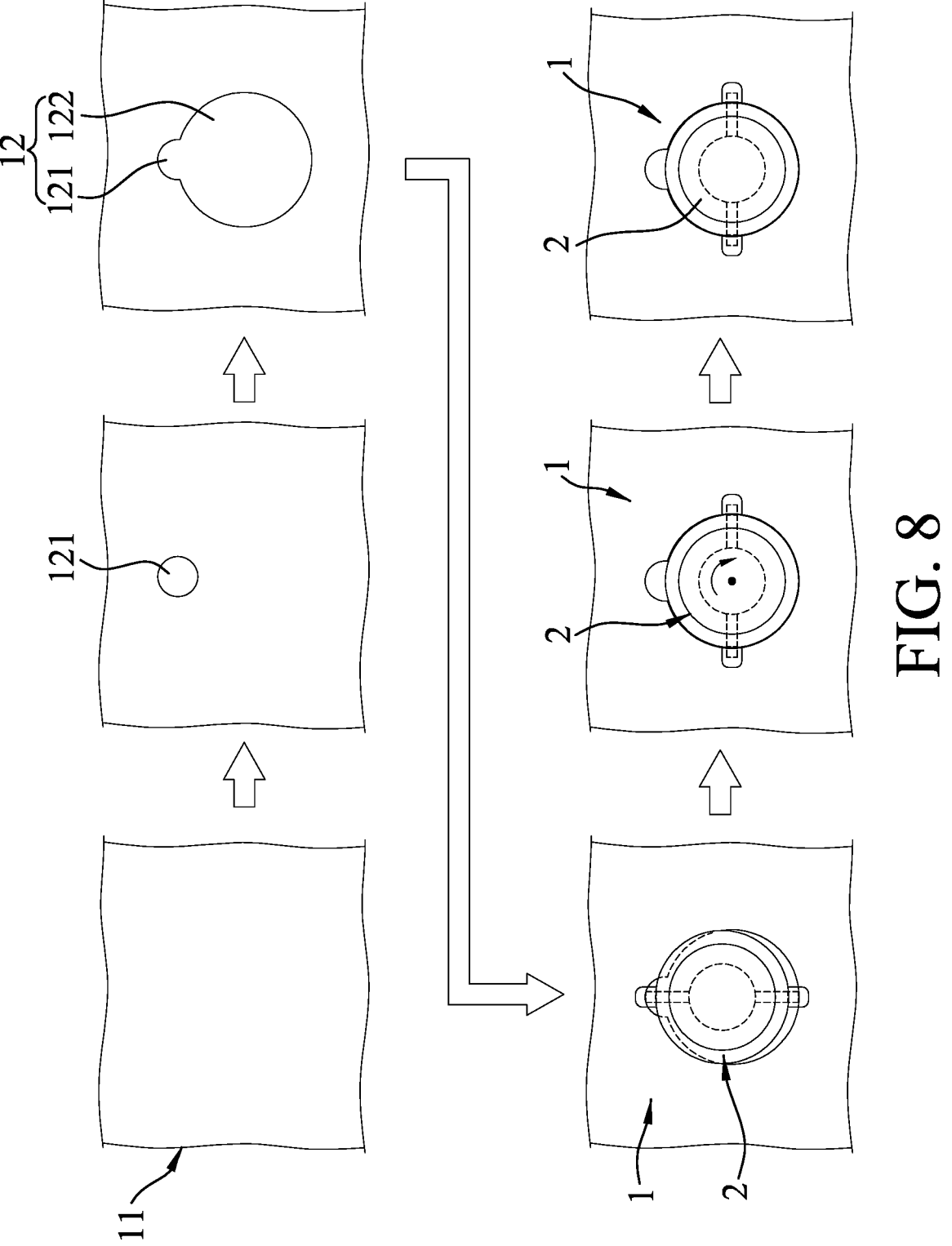
FIG. 8 is a corresponding top view of FIG. 7.

Referring to FIGS. 7 and 8, in combination with FIG. 5, the steps of a method of manufacturing the electronic device of the second embodiment are substantially the same as those of the method of manufacturing the electronic device of the first embodiment, but only differs in that the substrate 11 prepared in step a) has only one copper foil layer 114 covering the lower side of the base layer 113 and serving as the lower surface 112 thereof, the electroplating process of step c) (see FIGS. 3 and 4) is omitted, and in the soldering process of step e), the solder body 3 is soldered only to the protruding legs 23 and the copper foil layer 114.

In summary, through the additional provision of the expansion hole portion 121 to the insertion hole 12 of the circuit board 1, the maximum width (D) of the insertion hole 12 can be greater than the maximum distance (L) between the free ends of the protruding legs 23. When the insert member 2 is inserted into the insertion hole 12, the protruding legs 23 of the insert member 2 can easily pass through the maximum width (D) of the insertion hole 12 without bending or folding, and can be positioned after rotating the insert member 2 by an angle, so that the engaging function of the protruding legs 23 can be ensured, and the insert member 2 can be stably inserted and positioned. Furthermore, during the wave soldering process in the tin oven, the insert member 2 cannot be pushed upward by liquid tin. Hence, the process yield and reliability of this disclosure can be enhanced, and the object thereof can indeed be achieved.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An electronic device, comprising:

a circuit board including a substrate having an upper surface and a lower surface opposite to each other, and an insertion hole extending through said upper surface and said lower surface, said substrate including a base layer and two copper foil layers respectively covering upper and lower sides of said base layer and respectively serving as said upper surface and said lower surface of said substrate, said insertion hole having an expansion hole portion and an insertion hole portion connected to and communicating with each other, said insertion hole having a maximum width measured from one end of said insertion hole portion passing radially through the center of said insertion hole portion and the center of said expansion hole portion to one end of said expansion hole portion that is radially opposite to said one end of said insertion hole portion, said maximum width being greater than a hole diameter of said insertion hole portion, said hole diameter of said insertion hole portion being greater than a hole diameter of said expansion hole portion, and a conductive layer disposed in said insertion hole and electrically connected to said copper foil layers; and an insert member inserted into said insertion hole of said circuit board and including an axially extending terminal post, at least two protruding arms extending radially and outwardly from two diametrically opposed sides of said axially extending terminal post and resting on said upper surface of said substrate, and at least two protruding legs that extend upwardly and inclinedly from said two diametrically opposed sides of said axially extending terminal post, that are spaced apart from and located below said protruding arms and that abut against said lower surface of said substrate, a maximum distance measured from a free end of one of said at least two protruding legs to a free end of the other one of said at least two protruding legs being smaller than said maximum width of said insertion hole but greater than said hole diameter of said insertion hole portion.

2. The electronic device as claimed in claim 1, further comprising a solder body soldered between said insert member and said conductive layer of said circuit board.

3. The electronic device as claimed in claim 2, wherein said conductive layer has a cylindrical portion electroplated on a wall surface of said substrate that defines said insertion hole, and two annular portions that extend outwardly, radially and respectively from upper and lower ends of said cylindrical portion, that respectively surround upper and lower ends of said insertion hole and that are respectively electroplated on said copper foil layers, said solder body being soldered between said protruding arms and an upper one of said annular portions of said conductive layer, between said axially extending terminal post and said cylindrical portion of said conductive layer, and between said protruding legs and a lower one of said annular portions of said conductive layer.

* * * * *